(12) United States Patent
Griswold et al.

(10) Patent No.: US 10,614,359 B2
(45) Date of Patent: Apr. 7, 2020

(54) MAGNETIC RESONANCE FINGERPRINTING (MRF) SERIAL ARTIFICIAL NEURAL NETWORK (ANN) SEQUENCE DESIGN

(71) Applicant: Case Western Reserve University, Cleveland, OH (US)

(72) Inventors: Mark Griswold, Shaker Heights, OH (US); Nahal Geshnizjani, Cleveland, OH (US); Dan Ma, Cleveland, OH (US); Kenneth Loparo, Cleveland, OH (US); Jeffrey Sunshine, Pepper Pike, OH (US)

(73) Assignee: Case Western Reserve University, Cleveland, OH (US)

( * ) Notice: Subject to any disclaimer, the term of this patent is extended or adjusted under 35 U.S.C. 154(b) by 731 days.

(21) Appl. No.: 14/682,220

(22) Filed: Apr. 9, 2015

(65) Prior Publication Data

US 2015/0302297 A1    Oct. 22, 2015

Related U.S. Application Data

(60) Provisional application No. 61/981,756, filed on Apr. 19, 2014.

(51) Int. Cl.
*G06N 3/08* (2006.01)
*G01R 33/56* (2006.01)
(Continued)

(52) U.S. Cl.
CPC ............ *G06N 3/08* (2013.01); *G01R 33/5608* (2013.01); *G01R 33/448* (2013.01); *G01R 33/543* (2013.01); *G01R 33/56341* (2013.01)

(58) Field of Classification Search
CPC .... G06N 3/08; G01R 33/5608; G01R 33/448; G01R 33/543; G01R 33/56341; G01R 33/50; G01R 33/5602
See application file for complete search history.

(56) References Cited

U.S. PATENT DOCUMENTS 7,375,523 B1 * 5/2008 Hancu .................... G01R 33/10
324/307
7,639,010 B2   12/2009 Park
(Continued)

OTHER PUBLICATIONS

Dan Ma, Vikas Gulani, Nicole Seiberlich, Kecheng Liu, Jeffrey L. Sunshine, Jeffrey L. Duerk, and Mark A. Griswold, "Magnetic resonance fingerprinting", Mar. 14, 2013, Nature, vol. 495, pp. 187-193.*

(Continued)

*Primary Examiner* — Kamran Afshar
*Assistant Examiner* — Ying Yu Chen
(74) *Attorney, Agent, or Firm* — Quarles & Brady LLP

(57) ABSTRACT

Example apparatus and methods employ an artificial neural network (ANN) to automatically design magnetic resonance (MR) pulse sequences. The ANN is trained using transverse magnetization signal evolutions having arbitrary initial magnetizations. The trained up ANN may then produce an array of signal evolutions associated with a pulse sequence having user selectable pulse sequence parameters that vary in degrees of freedom associated with magnetic resonance fingerprinting (MRF). Efficient and accurate approaches are provided for predicting user controllable MR pulse sequence settings including, but not limited to, acquisition period and flip angle (FA). The acquisition period and FA may be different in different sequence blocks in the pulse sequence produced by the ANN. Predicting user controllable MR pulse sequence settings for both conventional MR and MRF (Continued)

facilitates achieving desired signal characteristics from a signal evolution produced in response to an automatically generated pulse sequence.

20 Claims, 12 Drawing Sheets

(51) Int. Cl.
*G01R 33/54* (2006.01)
*G01R 33/44* (2006.01)
*G01R 33/563* (2006.01)

(56) References Cited

U.S. PATENT DOCUMENTS

| | | | |
|---|---|---|---|
| 7,705,594 B2 | 4/2010 | Xu | |
| 8,717,023 B2 | 5/2014 | Griswold | |
| 8,723,518 B2 | 5/2014 | Seiberlich | |
| 8,723,519 B2 | 5/2014 | Boulant | |
| 2005/0256393 A1* | 11/2005 | Deoni | G01R 33/50 600/410 |
| 2008/0238425 A1* | 10/2008 | Xu | G01R 33/4833 324/322 |
| 2008/0278159 A1* | 11/2008 | Park | G01R 33/5615 324/307 |
| 2012/0105060 A1* | 5/2012 | Boulant | G01R 33/4828 324/309 |
| 2012/0235678 A1* | 9/2012 | Seiberlich | G01R 33/543 324/307 |
| 2012/0268123 A1* | 10/2012 | Griswold | G01R 33/448 324/309 |

OTHER PUBLICATIONS

Ray Freeman, "Selective Excitation in High-Resolution NMR", Nov. 1991, Chemical Reviews, vol. 91, No. 7, pp. 1397-1412.*

Nahal Geshnizjani, Kenneth A. Loparo, Dan Ma, and Mark A. Griswold, "MR Pulse Sequence Design with Artificial Neural Networks", 2012, Semantic Scholar, https://www.semanticscholar.org/paper/MR-Pulse-Sequence-Design-with-Artificial-Neural-Geshnizjani-Loparo/6a2392c60d5e40755439777355c07b2bdf93a4f4 pg. 1.*

Ma, D., et al., "Magnetic Resonance fingerprinting" Nature 495, 187-192 (Mar. 14, 2013).

Freeman, R., et al., "Selective Excitation in High-Resolution NMR" Nov. 1991, Chemical Reviews, vol. 91, No. 7, pp. 1397-1412.

Geshnizjani, N., et al, MR Pulse Sequence Design with Artificial Neural Networks Conference Abstract: ISMRM 2013, 2380.

Marschner, H et al, "Estimation of Parameters from Sparsely Sampled in-vivo Magnetization Transfer Data Using Artificial Neural Networks" Conference Abstract: ISMRM 2013, 4239.

* cited by examiner

MAGNETIC RESONANCE FINGERPRINTING (MRF) SERIAL ARTIFICIAL NEURAL NETWORK (ANN) SEQUENCE DESIGN

CROSS REFERENCE TO RELATED APPLICATIONS

This application claims the benefit of U.S. Provisional Patent Application 61/981,756 filed Apr. 19, 2014.

FEDERAL FUNDING NOTICE

The invention was made with government support under Federal Grant No 1RO1EB017219 awarded by the NIH. The Government has certain rights in the invention.

BACKGROUND

Scientists and radiologists may want to design and use a magnetic resonance imaging (MRI) pulse sequence that will produce a signal evolution having desired signal characteristics. The pulse sequence may have user controllable magnetic resonance (MR) settings including, for example, acquisition period (AP), or flip angle (FA). Conventional manual approaches to designing new sequences have been complex and time consuming. Conventional manual approaches may have produced a pulse sequence with a constant AP and FA. While this type of pulse sequence may have been useful for some applications, it may have had limited, if any, value in magnetic resonance fingerprinting.

An artificial neural network (ANN) has been used to facilitate automatically designing some new sequences that produce signals having desired signal characteristics. For example, using an ANN to predict MR sequence parameters for a desired signal output was demonstrated in N Geshnizjani et al, Conference Abstract: ISMRM 2013, 2380, and H Marschner at al, Conference Abstract: ISMRM 2013, 4239.

Conventional approaches apply known pulse sequences with known signal characteristics to train an ANN. However, these conventional approaches may have been constrained with respect to acceptable initial magnetizations and thus with respect to the range of signal evolutions that could be produced. While previous work has taken a first step in automating sequence design, improved approaches would facilitate producing signal evolutions with a range sufficient to support magnetic resonance fingerprinting.

Magnetic resonance fingerprinting (MRF) employs a series of varied sequence blocks that simultaneously produce different signal evolutions in different resonant species (e.g., tissues) to which radio frequency (RF) energy is applied. MRF sequence blocks may vary widely, either non-linearly, randomly, and/or pseudo-randomly. Since the sequence blocks may vary widely, the resulting signal evolutions may also vary widely. Sequence blocks may vary in a number of parameters including, but not limited to, echo time, flip angle, phase encoding, diffusion encoding, flow encoding, RF pulse amplitude, RF pulse phase, number of RF pulses, type of gradient applied between an excitation portion of a sequence block and a readout portion of a sequence block, number of gradients applied between an excitation portion of a sequence block and a readout portion of a sequence block, type of gradient applied between a readout portion of a sequence block and an excitation portion of a sequence block, number of gradients applied between a readout portion of a sequence block and an excitation portion of a sequence block, type of gradient applied during a readout portion of a sequence block, number of gradients applied during a readout portion of a sequence block, amount of RF spoiling, or amount of gradient spoiling. In different embodiments two, three, four, or more parameters may vary between sequence blocks. In different embodiments, the number of parameters varied between sequence blocks may itself vary. For example, A1 (sequence block 1) may differ from A2 in five parameters, A2 may differ from A3 in seven parameters, A3 may differ from A4 in two parameters, and so on. One skilled in the art will appreciate that there are a nearly infinite number of series of sequence blocks that can be created by varying this large number of parameters.

Conventional ANN approaches may have facilitated producing a pulse sequence having fixed parameters. Designing conventional pulse sequences that have constant sequence blocks and fixed parameters involves a first level of complexity. Designing MRF pulse sequences that have varied sequence blocks suitable for MRF involves a second higher level of complexity.

The term "resonant species", as used herein, refers to an item (e.g., water, fat, tissue, material) that can be made to resonate using nuclear magnetic resonance (NMR). By way of illustration, when RF energy is applied to a volume that has bone and muscle tissue, then both the bone and muscle tissue will produce an NMR signal. However the "bone signal" and the "muscle signal" will be different and can be distinguished using MRF. The different signals can be collected over a period of time to identify a signal evolution for the volume. Resonant species in the volume can then be characterized by comparing the signal evolution to known evolutions. Characterizing the resonant species may include identifying a material or tissue type, or may include identifying MR parameters associated with the resonant species. The "known" evolutions may be, for example, simulated evolutions or previously acquired evolutions. A large set of known evolutions may be stored in a dictionary.

Characterizing the resonant species can include identifying different properties of a resonant species (e.g., T1, T2, diffusion resonant frequency, diffusion co-efficient, spin density, proton density). Additionally, other properties including, but not limited to, tissue types, materials, and super-position of attributes can be identified. These properties may be identified simultaneously using MRF, which is described in U.S. Pat. No. 8,723,518 "Nuclear Magnetic Resonance (NMR) Fingerprinting" and in *Magnetic Resonance Fingerprinting*, Ma et al., Nature 495, 187-192 (14 Mar. 2013), the contents of both of which are incorporated herein by reference.

DETAILED DESCRIPTION

Figure 1:
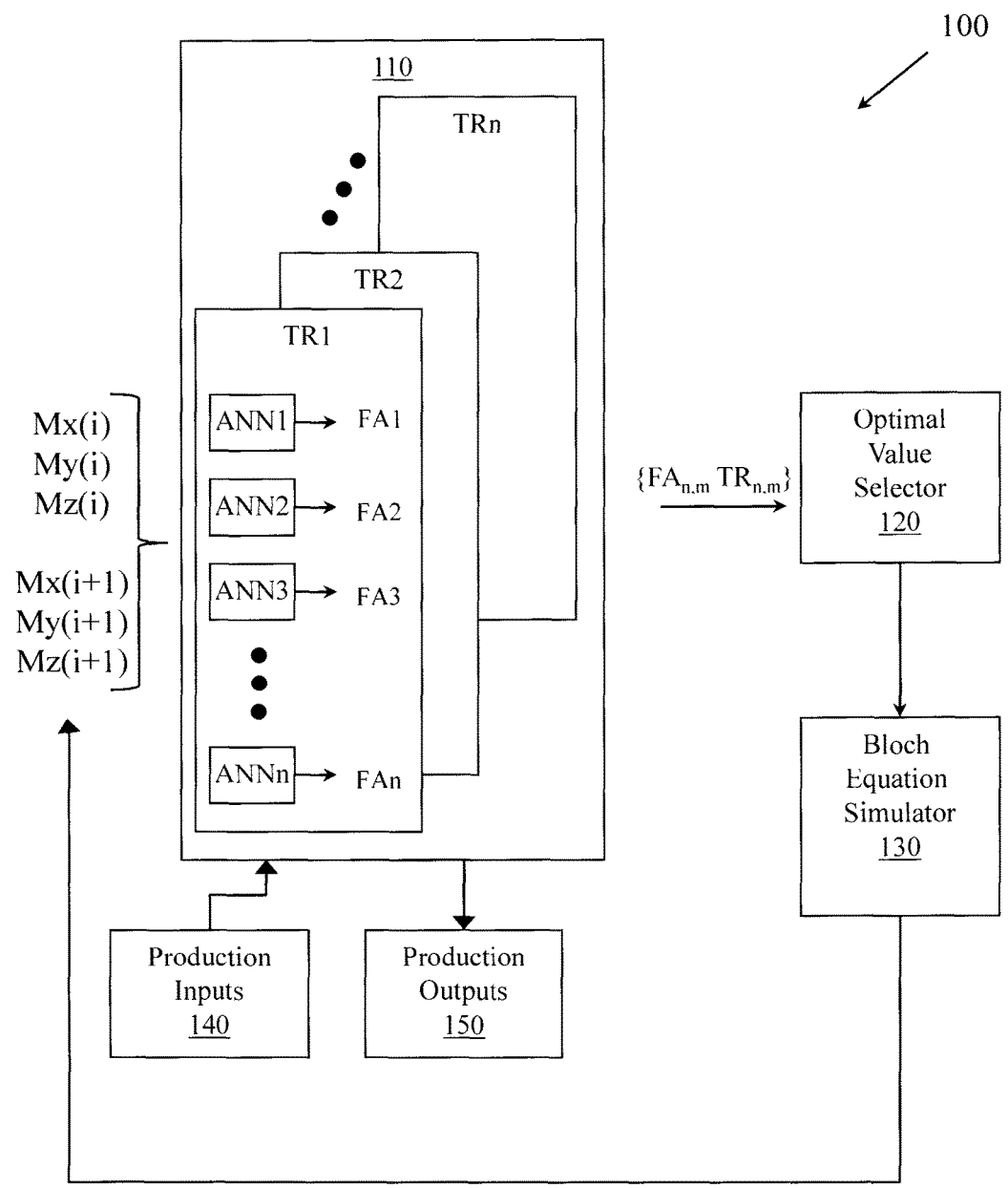
FIG. 1 illustrates an example apparatus for training and using an ANN for automated MR pulse sequence design.

Example apparatus and methods train an artificial neural network (ANN) using transverse magnetization signal evolutions having arbitrary initial magnetizations. Since arbitrary initial magnetizations can be used, a much wider array of signal evolutions may be produced. In one embodiment, the array of signal evolutions may even be comprehensive enough to support magnetic resonance fingerprinting applications. When the ANN has been trained, the ANN can then be used to automatically produce a pulse sequence with user controllable MR pulse settings (e.g., AP, FA) that will yield a desired signal evolution.

Magnetic resonance (MR) uses pulse sequences. In MRF, the pulse sequences may vary from sequence block to sequence block. Example apparatus and methods provide efficient and accurate approaches for targeting user controllable MR pulse sequence settings including, but not limited to, acquisition period (AP) and flip angle (FA). The AP and FA may be different for different sequence blocks in the pulse sequence produced by the ANN. Targeting user controllable MR pulse sequence settings for both conventional MR and MRF facilitates achieving desired signal characteristics from a signal evolution produced in response to a pulse sequence. Example apparatus and methods may employ an ANN to automatically design MR pulse sequences.

Example apparatus and methods provide an ANN model that can handle signal evolutions with arbitrary initial magnetization and that can, therefore, produce a wider array of desired SE. Example apparatus and methods facilitate accelerating quantitative imaging in general and also facilitate accelerating MRF. For MRF, the extra flexibility in sequence design and acceptable signal behavior makes it difficult, if even possible at all, to simply intuit efficient pulse sequences that produce optimal results. Thus, automated approaches are sought.

ANNs may be based on properties of biological neural systems. For example, one type of ANN may include a large number of highly interconnected elements (e.g., neurons) that operate in parallel. See, for example, S. Haykin, Neural Networks: A comprehensive foundation, Prentice Hall, 1998, ISBN 0-1327-3350-1. An ANN may be trained from available data to perform a particular function. For example, an ANN may be trained to perform pattern recognition, to perform prediction, or to perform other tasks. For ANNs using optimization methods, training may be performed using a back propagation algorithm that seeks to minimize an error function defined as the absolute difference between a target value and a predicted value. Other error functions may be employed. Training a back propagation model may include iterating through an input, output, compare, and feedback process until a convergence threshold is met as identified by supervised or unsupervised learning.

Training the ANN involves accessing an initial signal (e.g., a known TrueFISP pulse sequence) and presenting a set of known magnetizations to the ANN training system. The ANN training system may then produce a set of target FA and AP based on the inputs. An optimal FA and AP can be selected by minimizing an error function that considers members of the set of FA and members of the set of AP. The error function may include the results of a Bloch simulation of FA and AP. Once the optimal FA and AP have been selected, nodes in the ANN may be updated to reflect the selections. For example, weights on links between nodes may be updated. A Bloch equation simulator may then use the optimal FA and AP to produce a new set of magnetizations that will be used as inputs for the next iteration of ANN training.

In NMR, MRI, or ESR (electron spin resonance), a Bloch equation is a member of a set of macroscopic equations that are used to calculate the nuclear magnetization $M=(M_x, M_y, M_z)$ as a function of time when relaxation times $T_1$ and $T_2$ are present. These phenomenological equations were introduced by Felix Bloch and may also be referred to as the equations of motion of nuclear magnetization. One skilled in the art will appreciate that in one embodiment $Ri(\alpha)$, $R_{RFij}(\alpha,\phi)$, and $R(G)$ may be viewed as Bloch equations.

In one embodiment, an ANN may have multiple individual blocks of nodes that are specific to an AP value. In a second embodiment, the ANN may have one block of ANN nodes that are specific to an AP value. In this second embodiment, a block of nodes may be specific to one octant in a three dimensional space associated with the resulting signal evolution. Error functions may be different for the two different models.

Regardless of the model, once the ANN has been trained, then a new pulse sequence can be automatically generated using the ANN. In this production phase, values for user adjustable settings (e.g., FA, AP) may be accessed and provided to the trained up ANN. Additionally, information about the desired signal evolution may be provided to the trained up ANN. The trained up ANN can then produce information associated with a new pulse sequence that will produce a signal evolution having the desired characteristics.

Figure 10:
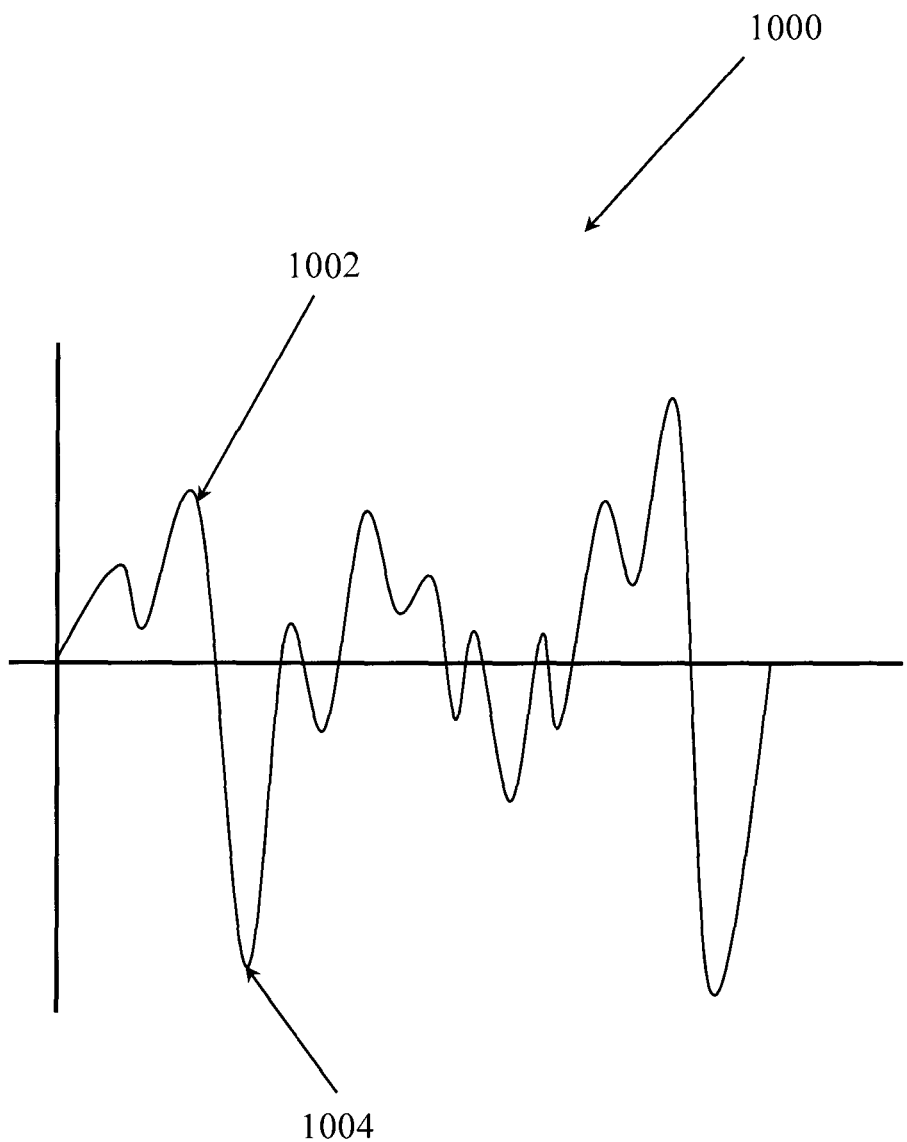
FIG. 10 illustrates an example signal evolution used in MRF.

FIG. 10 illustrates an example signal evolution 1000 produced in response to an MRF pulse sequence. There are multiple signal points on signal evolution 1000. Two signal points 1002 and 1004 are indicated. Training an ANN to produce a pulse sequence that will produce signal evolution 1000 may include training the ANN to produce a pulse sequence that produces a series of signal points. For example, training the ANN may include training it to produce a pulse sequence that will produce signal point 1002 and signal point 1004. Training the ANN to produce a single signal point may involve multiple iterations of training where information from a known pulse sequence or initial signal are used to train the ANN with respect to training outputs that are produced.

FIG. 1 illustrates a system 100 for training an ANN 110 and for using the ANN 110 after it has been trained up. In this embodiment there are multiple blocks of ANN nodes in ANN 110, with separate blocks of ANN nodes for different AP values being evaluated. Due to redundancies in the inverses of trigonometric functions over an entire range of FAs, an ANN in a block is constrained to a small FA range. The inputs to system 100 are $[M_{xi}, M_{yi}, M_{zi}]$ and $[M_{xi+1}, M_{yi+1}, M_{zi+1}]$, which are the magnetization before and after the $i+1^{th}$ excitation, respectively. $M_0$ represents an initial magnetization. Unlike conventional systems, $M_0$ may be arbitrary. $[M_{xi}, M_{yi}, M_{zi}]$ represent known magnetizations, and $[M_{xi+1}, M_{yi+1}, M_{zi+1}]$ represent the predicted magnetizations produced by an iteration of the system 100. The inputs are processed by the ANN 110 to produce a set of FA and AP. An optimal value selector 120 selects the best FA and AP by minimizing an error function. The best FA and AP are then used by a Bloch equation simulator 130 to produce target signals for the next training iteration for system 100. After a threshold number of iterations, or after a convergence threshold has been reached, the ANN 110 may be ready for production. The convergence threshold may be reached, for example, when the target signal matches the actual known signal to within a desired tolerance. When the ANN 110 is deemed ready for production usage, then production inputs 140 may be provided to ANN 110 which will then produce production outputs 150 that include, for example, an output pulse sequence.

Figure 2:
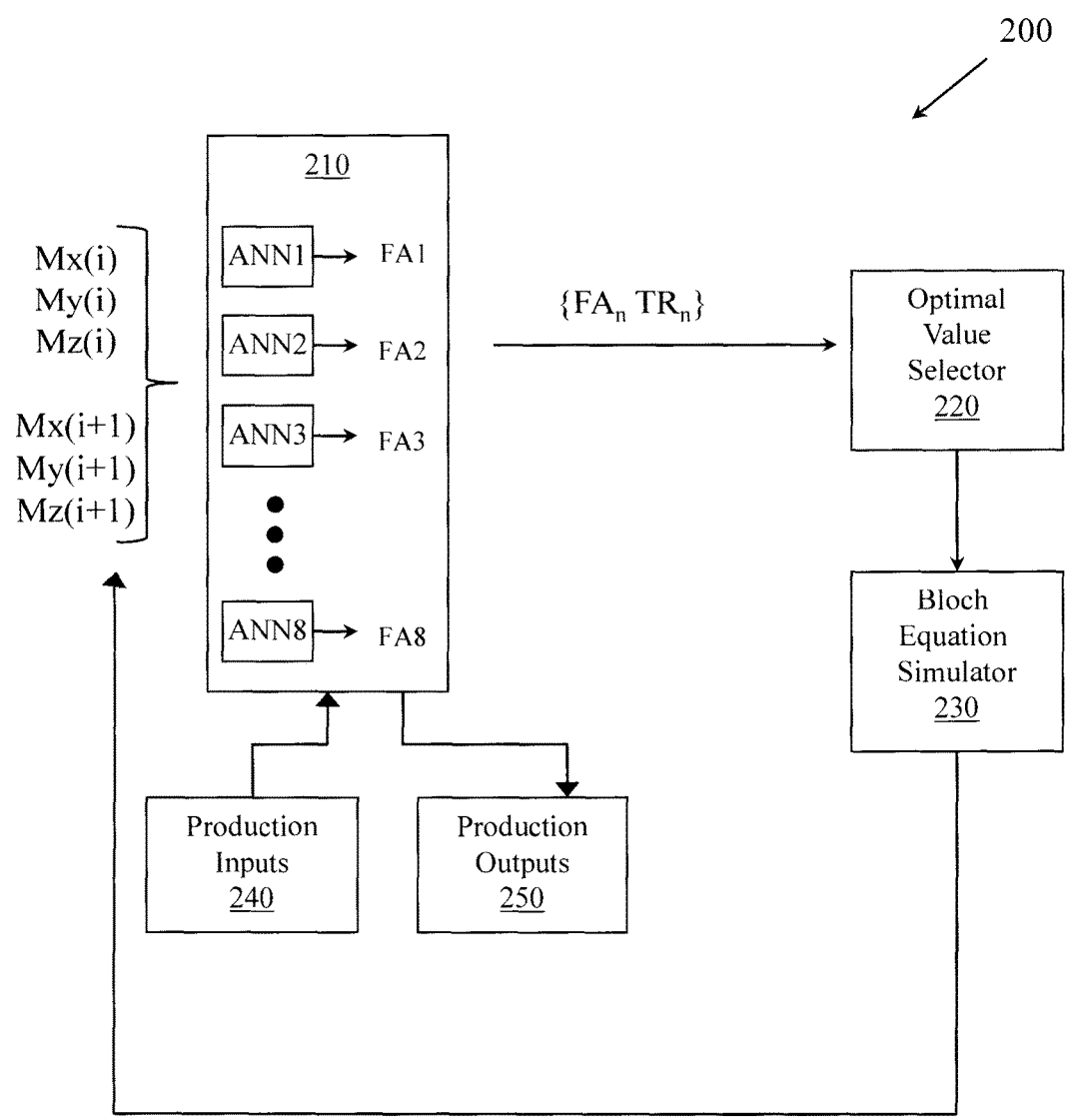
FIG. 2 illustrates an example apparatus for training and using an ANN for automated MR pulse sequence design.

FIG. 2 illustrates a system 200 for training an ANN 210 and for using the ANN 210 after it has been trained. In this embodiment, there is a single block of ANN nodes in ANN 210 for different AP values being evaluated. Due to redundancies in the inverses of trigonometric functions over an entire range of FAs, an ANN in a block is constrained to a small FA range. The inputs to system 200 are $[M_{xi}, M_{yi}, M_{zi}]$ and $[M_{xi+1}, M_{yi+1}, M_{zi+1}]$, which are the magnetization before and after the i+1$^{th}$ excitation, respectively. In this example, the ANN 210 has eight blocks of ANN nodes (e.g., ANN1 ANN8) and a single block of ANN nodes is associated with one octant of a three dimensional space associated with a signal evolution. Different numbers of blocks of ANN nodes may be employed that partition a three dimensional space in different ways. The inputs are processed by the ANN 210 to produce a set of predicted FA and AP. An optimal value selector 220 selects the best FA and AP by minimizing an error function. The best FA and AP are then used by a Bloch equation simulator 230 to produce target signals for the next training iteration for system 200. After a threshold number of iterations or after a convergence threshold has been reached, the ANN 210 may be ready for production. The convergence threshold may be reached, for example, when the target signal matches the actual known signal to within a desired tolerance. When the ANN 210 is deemed ready for production usage, then production inputs 240 may be provided to ANN 210 which will produce production outputs including, for example, an output pulse sequence.

Initially, an untrained ANN will likely produce substantially random outputs given a set of input magnetizations. One of these random outputs may be selected as the "best" output even though it may not match a similarity threshold. It may be best simply because it yields the minimum value in an error function when compared to all the other outputs. The best output can be used to train the ANN by, for example, strengthening links between nodes that contributed to the best output and by weakening links between nodes that did not contribute the best output or that contributed to other outputs. An ANN can be trained in other ways but generally the developing outputs are compared to target outputs and the training seeks to adjust the ANN so that future outputs are more like the target outputs.

During development of some example apparatus and methods, ANN models were trained using the transverse magnetization signal evolutions of a TrueFISP pulse sequence calculated via Bloch simulations. These type of signal evolutions can be accurately calculated for a large (e.g., approaching infinity) set of sample training data.

In one embodiment, an ANN's inputs in a block are $[M_{xi}, M_{yi}, M_{zi}]$ and $[M_{xi+1}, M_{yi+1}, M_{zi+1}]$, which are the magnetization before and after the i+1$^{th}$ excitation, respectively. The ANN outputs an $FA_{n,m}$ that represents a predicted FA of ANN n at block m. The optimum FA is the FA that minimizes:

$$\|s(i) - BE(FA_{n,m}, AP_{n,m})\|$$

where S(i) is the signal at the i$^{th}$ excitation in transverse plane, $AP_{n,m}$ is the specific acquisition period of the N$^{th}$ ANN in the block m and $BE(FA_{n,m}, AP_{n,m})$ is the result of the Bloch simulation of $FA_{n,m}$ and $AP_{n,m}$. Bloch simulation may be applied again to create the next magnetization using the target FA and acquisition period.

During development, example ANNs were trained with large numbers (e.g., 40,000) of transverse magnetization evolutions from a known pulse sequence (e.g., TrueFISP) having arbitrary initial magnetizations. Signal evolutions included random flip angles in a range of 0 to 30 degrees, acquisition periods in a range of 5-10 ms, and T1 and T2 of three different tissues of T1/T2=[300/40, 600/70, 900/90]. T1 refers to spin-lattice relaxation and T2 refers to spin-spin relaxation. Example apparatus and methods were evaluated by using the model to target the settings for sequences constructed from an initial magnetization of [0, 0, −1] and randomly selected flip angles in the range of 0 to 6 degrees, and 128 excitations.

Figure 3:
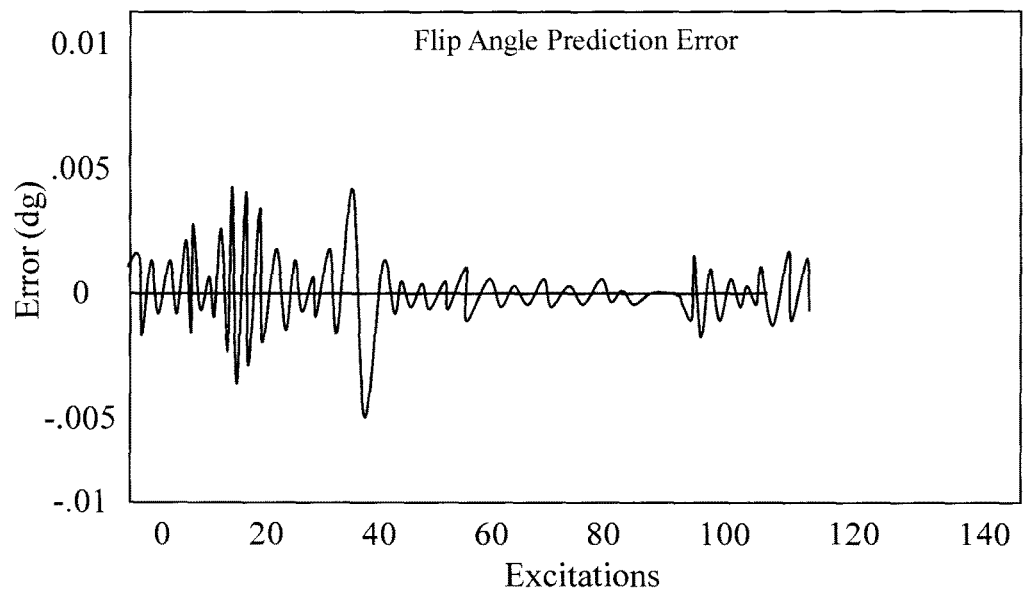
FIG. 3 illustrates errors between FAs.
Figure 4:
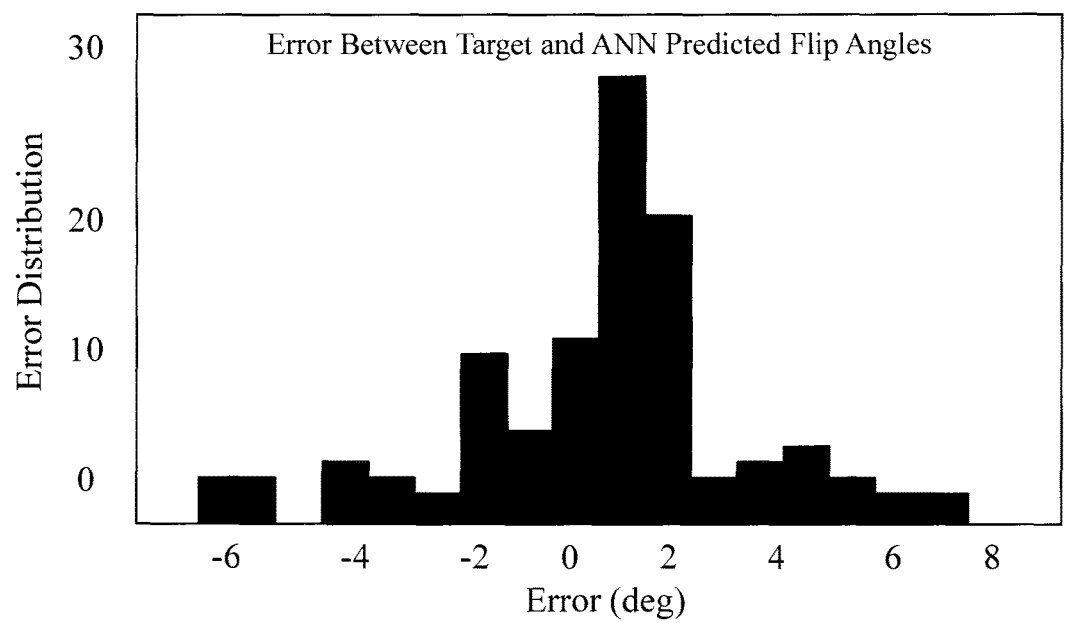
FIG. 4 illustrates a histogram of errors between FAs.
Figure 11:
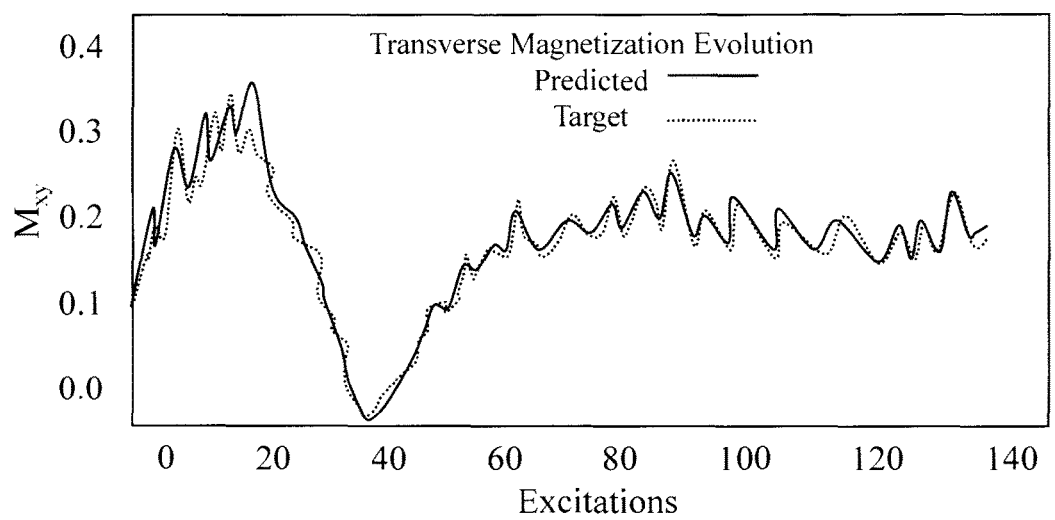
FIG. 11 illustrates transverse magnetization evolution.

FIG. 3 illustrates the errors between target and produced flip angles over the entire sequence. FIG. 4 illustrates a histogram of the errors. FIG. 11 illustrates the target transverse magnetization and the signal obtained using the flip angles. The overall performance of example apparatus and methods was within acceptable bounds for both FA and transverse magnetization with MSE less than or equal to $1 \times 10^{-3}$. Thus, ANN produced by example apparatus and methods have been demonstrated to automate MR pulse sequence design. ANN-based automated MR pulse sequence design may be employed when a wide array of signal evolutions are possible and desirable as, for example, in MRF. For example, an ANN may be trained using signal evolutions selected from those described by:

$$SE = \Pi_{i=1}^{N_A} \Sigma_{j=1}^{N_{RF}} R_i(\alpha) R_{RF_{ij}}(\alpha,\varphi) R(G) E_i(T1,T2,D) M_0 \quad [1]$$

where:
SE is a signal evolution,
$N_A$ is a number of sequence blocks,
$N_{RF}$ is a number of RF pulses in a sequence block,
α is a flip angle,
φ is a phase angle,
$Ri(\alpha)$ is a rotation due to off resonance,
$R_{RFij}(\alpha,\varphi)$) is a rotation due to RF differences,
R(G) is a rotation due to a gradient,
T1 is spin-lattice relaxation,
T2 is spin-spin relaxation,
D is diffusion relaxation,
$E_i(T1,T2,D)$ is decay due to relaxation differences, and
$M_0$ is the default or equilibrium magnetization.

While $E_i(T1,T2,D)$ is provided as an example, one skilled in the art will appreciate that in different embodiments, $E_i(T1,T2,D)$ may actually be $E_i(T1,T2,D, \ldots)$, or $E_i(T1, T2, \ldots)$.

In one example, the summation on j could be replaced by a product on $$SE = \Pi_{i=1}^{N_A} \Sigma_{j=1}^{N_{RF}} R_i(\alpha) R_{RF_{ij}}(\alpha,\varphi) R(G) E_i(T1,T2,D) M_0 \quad [2]$$

Figure 12:
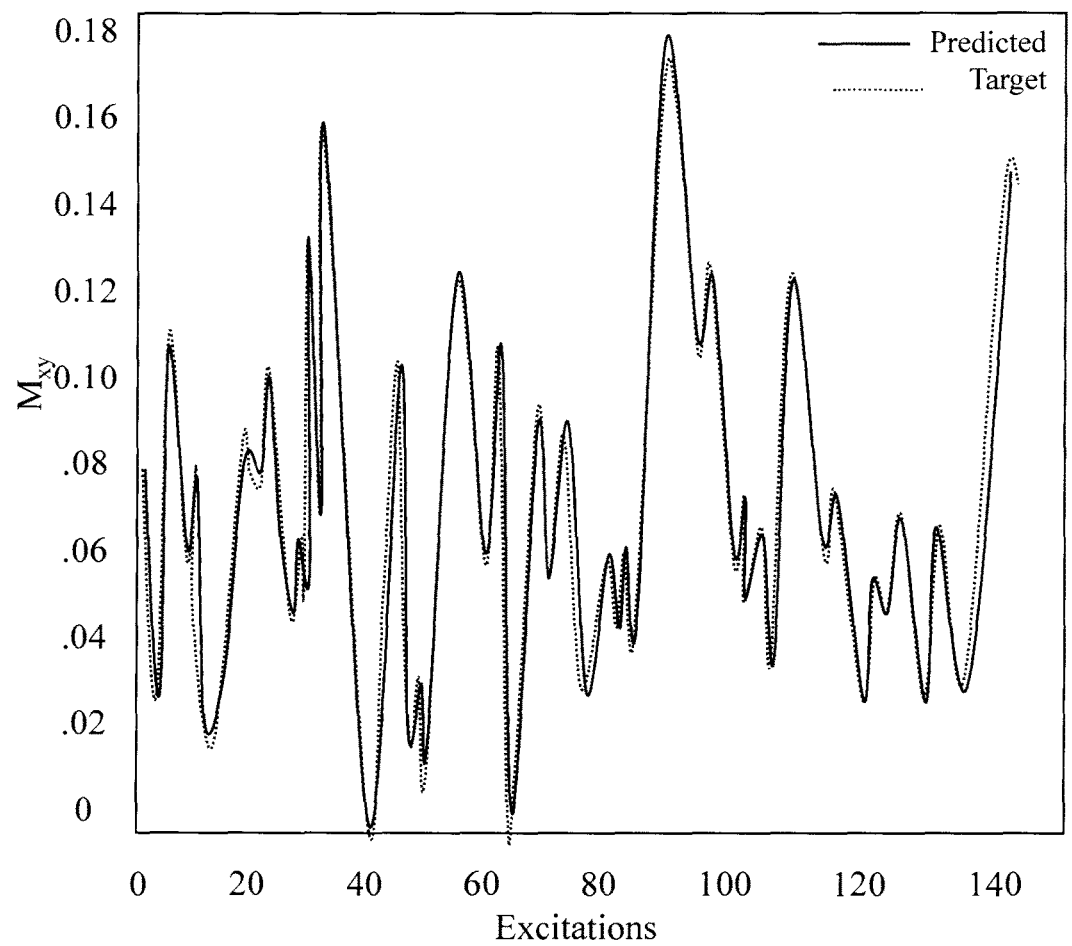
FIG. 12 illustrates the target transverse magnetization of random FA and acquisition period and the signal obtained using FAs and acquisition periods from T1/T2=[300/50].

Once an ANN has been trained to produce desirable results, the ANN may then be used to quickly and accurately produce sequence settings needed for a desired signal evolution. Example apparatus and methods were tested with several signals of randomly selected FAs in the range of 0 to 60 degrees and randomly selected APs in the range of 5 to 20 ms during 128 excitations. FIG. 12 illustrates the target transverse magnetization of random FA and acquisition period and the signal obtained using target FAs and AP for T1/T2=[300/50].

The range of signal evolutions that may be used to train the ANN or that may subsequently be produced by the trained up ANN may include signal evolutions that are described by equation 1 or equation 2. The range of signal evolutions that may be used to train the ANN or that may subsequently be produced by the trained up ANN may also include signal evolutions that are described by:

$$S_i = R_i E_i(S_{i-1}) \quad [3]$$

or $$S_i = R_i E_i \sum_{x=1}^{i-1} R_x E_x(S_x) \quad [4]$$

or $$S_i = R_i E_i \prod_{x=1}^{i-1} R_x E_x(S_x) \quad [5]$$

where:
$S_0$ is the default or equilibrium magnetization,
$S_i$ is a vector that represents the different components of the magnetization Mx, My, Mz during acquisition block i,
$R_i$ is the combination of rotational effects that occur during acquisition block i, and
$E_i$ is the combination of effects that alter the amount of magnetization in the different states for acquisition block i.

The range of signal evolutions that may be used to train the ANN or that may subsequently be produced by the trained up ANN may include signal evolutions that are described by:

$$S_i = \sum_{s=1}^{N_s} R_{s,i} E_{s,i}(S_{s,i-1}) \quad [6]$$

or $$S_i = \sum_{s=1}^{N_s} R_{s,i} E_{s,i} \sum_{x=1}^{i-1} R_{s,x} E_{s,x}(S_{s,x}) \quad [7]$$

or $$S_i = \sum_{s=1}^{N_s} R_{s,i} E_{s,i} \prod_{x=1}^{i-1} R_{s,x} E_{s,x}(S_{s,x}) \quad [8]$$

where:
$S_0$ is the default or equilibrium magnetization,
Ns is the number of spins,
$S_i$ is a vector that represents the different components of the magnetization Mx, My, Mz during acquisition block i,
$R_{i,s}$ is the sum of rotational effects that occur during acquisition block i for spin s, and
$E_{i,s}$ is the sum of effects that alter the amount of magnetization in the different states for acquisition block i for spin s.

Some portions of the detailed descriptions that follow are presented in terms of algorithms and symbolic representations of operations on data bits within a memory. These algorithmic descriptions and representations are used by those skilled in the art to convey the substance of their work to others. An algorithm is considered to be a sequence of operations that produce a result. The operations may include creating and manipulating physical quantities that may take the form of electronic values. Creating or manipulating a physical quantity in the form of an electronic value produces a concrete, tangible, useful, real-world result.

It has proven convenient at times, principally for reasons of common usage, to refer to these signals as bits, values, elements, symbols, characters, terms, numbers, and other terms. It should be borne in mind, however, that these and similar terms are to be associated with the appropriate physical quantities and are merely convenient labels applied to these quantities. Unless specifically stated otherwise, it is appreciated that throughout the description, terms including processing, computing, and determining, refer to actions and processes of a computer system, logic, processor, or similar electronic device that manipulates and transforms data represented as physical quantities (e.g., electronic values).

Example methods may be better appreciated with reference to flow diagrams. For simplicity, the illustrated methodologies are shown and described as a series of blocks. However, the methodologies may not be limited by the order of the blocks because, in some embodiments, the blocks may occur in different orders than shown and described. Moreover, fewer than all the illustrated blocks may be required to implement an example methodology. Blocks may be combined or separated into multiple components. Furthermore, additional or alternative methodologies can employ additional, not illustrated blocks.

Figure 5:
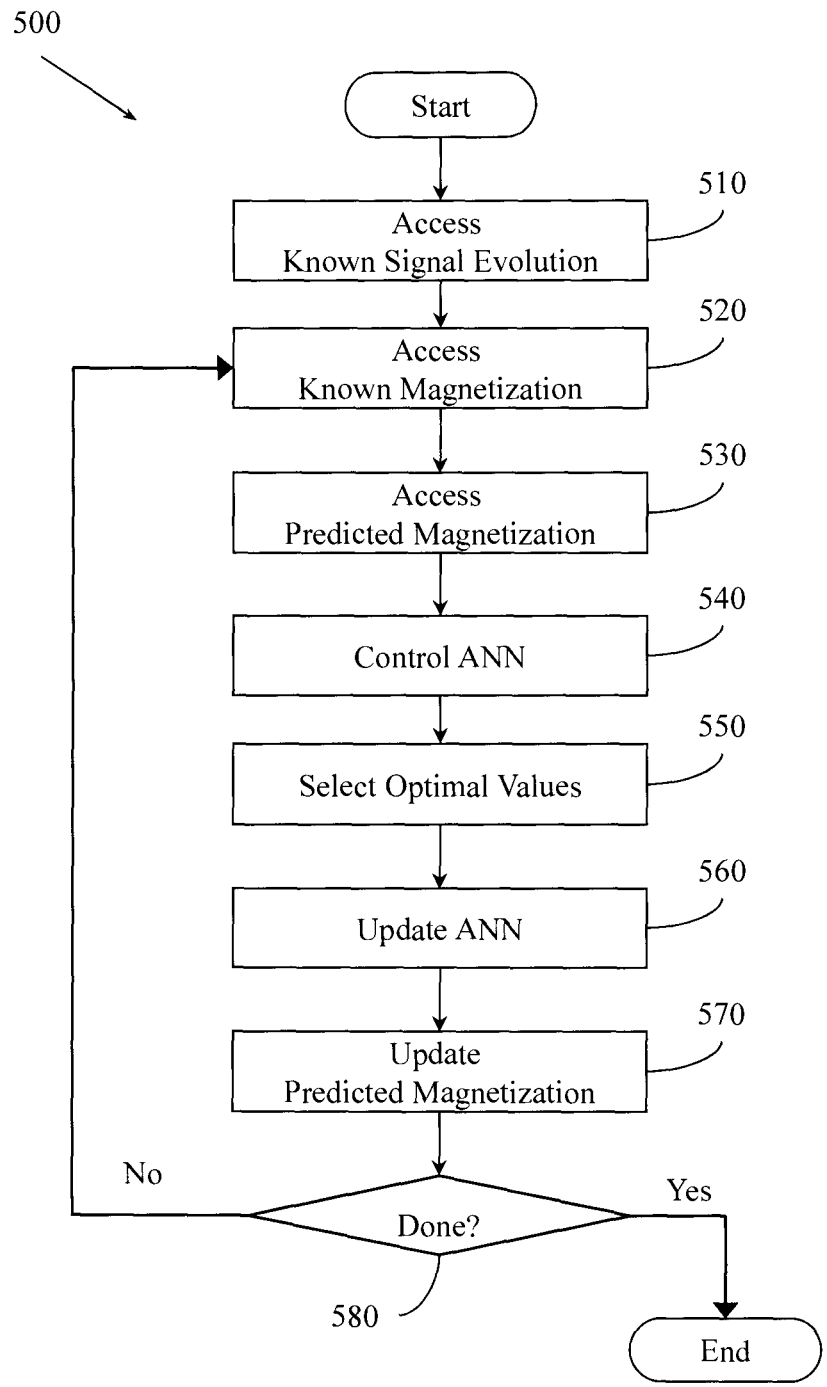
FIG. 5 illustrates an example method for training an ANN for automated MR pulse sequence design.

FIG. 5 illustrates an example method 500 for training an ANN for automated MR pulse sequence design. Method 500 may include, at 510, accessing an initial signal associated with a known pulse sequence. Accessing an initial signal may include, for example, opening a computer file where information describing the signal is stored, receiving electronic data describing the signal, reading electronic data from a computer memory, or other computerized action. In different embodiments the initial signal may be described by any of equations 1-8. In one embodiment, the known pulse sequence is a TrueFISP signal.

Method 500 may also include, at 520, accessing a set of initial magnetization values associated with the known signal. Accessing a known magnetization value may include, for example, reading a value from a register in a processor, receiving electronic data via a function call, opening a file or other data structure in which the magnetization value is stored, or other action. In one embodiment, the set of initial magnetization values include arbitrary initial magnetizations.

Method 500 may also include, at 530, accessing a set of target magnetization values. This action may be part of an iterative process that employs feedback for machine-learning based training of an ANN. The target magnetization values may be produced by a Bloch equation simulator, circuit, or logic that inputs optimal values selected from a range of values produced by the ANN.

Thus, method 500 includes, at 540, controlling the ANN to produce a set of FA values for the MRF pulse sequence and a set of AP values for the MRF pulse sequence. The ANN may produce the values based, at least in part, on the set of initial magnetization values and the set of target magnetization values. While FA and AP values are described, more generally method 500 may include controlling the ANN to produce one or more values for one or more MR pulse sequence parameters.

Method 500 may also include, at 550, selecting an optimal FA value from the set of FA values or selecting an optimal AP value from the set of AP values. More generally, method 500 may include, at 550, selecting an optimal value from the one or more values produced by the ANN in response to accessing the initial signal evolution, the initial magnetization, and the target magnetization. In one embodiment, the optimal FA value or the optimal AP value is selected based, at least in part, by identifying a member of the set of FA values or a member of the set of AP values that minimize an error function.

Different types of ANNs may be used in different embodiments. Additionally, an ANN may be arranged with different collections of nodes. In one embodiment, the ANN may have one block of ANN nodes per AP value being evaluated. In this embodiment, the optimal FA value or the optimal acquisition period value is selected by identifying the member of the set of target FA values and the member of the set of target AP values that minimize the error function:

$$\|s(i) - BE(FA_n, AP_n)\| \quad [9]$$

where S(i) is the signal at the $i^{th}$ excitation in transverse plane, $FA_n$ is the flip angle for $AP_n$, $AP_n$ is the specific acquisition period of the $N^{th}$ collection of ANN nodes in the ANN and $BE(FA_n, AP_n)$ is the result of the Bloch simulation of $FA_n$ and $AP_n$.

In another embodiment, the ANN may have M blocks of ANN nodes per AP, M being an integer. In this embodiment, the optimal FA value or the optimal AP value is selected by identifying the member of the set of target FA values and the member of the set of target AP that minimize:

$$\|s(i) - BE(FA_{n,m}, AP)\| \quad [10]$$

where:
S(i) is the signal at the $i^{th}$ excitation in transverse plane, i being a number,
$FA_{n,m}$ is the specific FA of the $N^{th}$ ANN in the block m, n and m being numbers,
$AP_{n,m}$ is the specific AP of the $N^{th}$ ANN in the block m, and
$BE(FA_{n,m}, AP_{n,m})$ is the result of a Bloch simulation of $FA_{n,m}$ and $AP_{n,m}$.

Initially, an ANN may produce substantially random values. Training an ANN may involve iterations of producing outputs from presented inputs and then updating the ANN with information about which of the outputs are to be enhanced or kept and which of the outputs are to be discarded or diminished. Thus, method 500 may include, at 560, updating the ANN based, at least in part, on the optimal FA value or the optimal AP value. More generally, method 500 may include updating the ANN based on the optimal values selected from the produced values.

Once the optimal values are available, the optimal values may be used to produce new magnetizations that are fed back to the input side of the ANN for future training. Thus, method 500 may include, at 570, controlling a Bloch simulator to update the set of target magnetization values based, at least in part, on the optimal FA value or the optimal AP value.

At 580 a determination may be made concerning whether the ANN has been trained to a desired level. In one embodiment, the decision may be made based on the number of iterations performed in training. In another embodiment, the decision may be made based on the outputs matching known or target inputs to within a desired amount. In different embodiments, the decision may be fully automated, partially automated, or subject to human supervised learning. If the determination at 580 is that training is done, then method 500 may conclude. If the determination at 580 is that training is not done, then processing may return to 520 where the newly updated magnetization may be used with the initial magnetization for another iteration of presenting inputs to the ANN and receiving outputs from the ANN.

Figure 6:
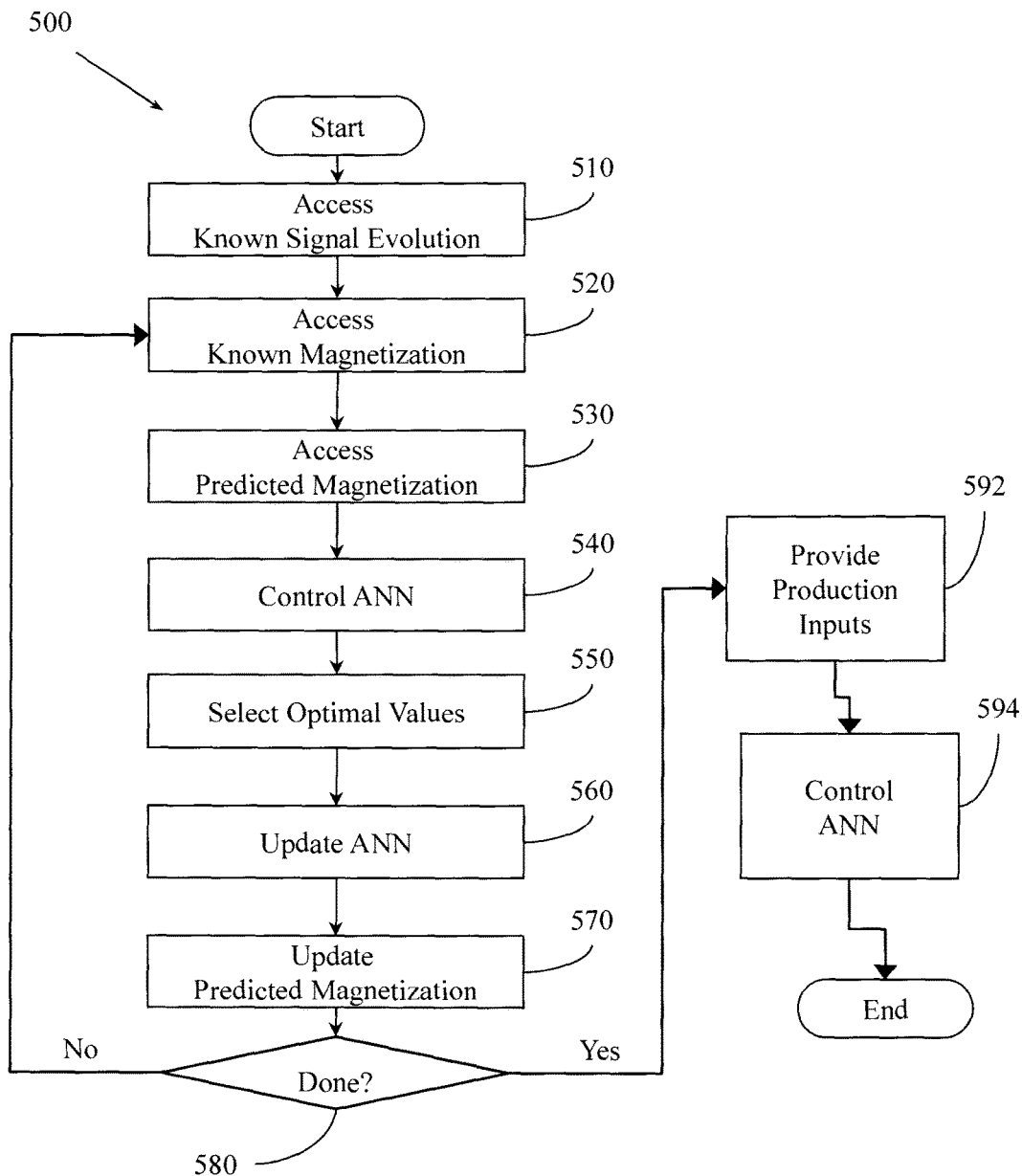
FIG. 6 illustrates an example method for training and using an ANN for automated MR pulse sequence design.

FIG. 6 illustrates an embodiment of method 500 that is used both for training and using an ANN for automated MR pulse sequence design. This embodiment includes all the actions from 510 through 580 described in connection with FIG. 5. However, after training is complete, this embodiment of method 500 may proceed, at 592, to present production inputs to the trained up ANN. The production inputs may include, for example, desired pulse sequence parameters (e.g., AP, FA), desired signal evolution parameters (e.g., number of points, amplitude range, average slope, maximum slope,) or other information.

Once the inputs have been provided to the trained up ANN, then method 500 may include, at 594, controlling the ANN to produce a new pulse sequence based, at least in part, on the set of production inputs. In one embodiment, the new pulse sequence may vary echo time or flip angle between sequence blocks. More generally, the new pulse sequence may vary parameters including, but not limited to, echo time, flip angle, phase encoding, diffusion encoding, flow encoding, RF pulse amplitude, RF pulse phase, number of RF pulses, type of gradient applied between an excitation portion of a sequence block and a readout portion of a sequence block, number of gradients applied between an excitation portion of a sequence block and a readout portion of a sequence block, type of gradient applied between a readout portion of a sequence block and an excitation portion of a sequence block, number of gradients applied between a readout portion of a sequence block and an excitation portion of a sequence block, type of gradient applied during a readout portion of a sequence block, number of gradients applied during a readout portion of a sequence block, amount of RF spoiling, or amount of gradient spoiling between sequence blocks.

Figure 7:
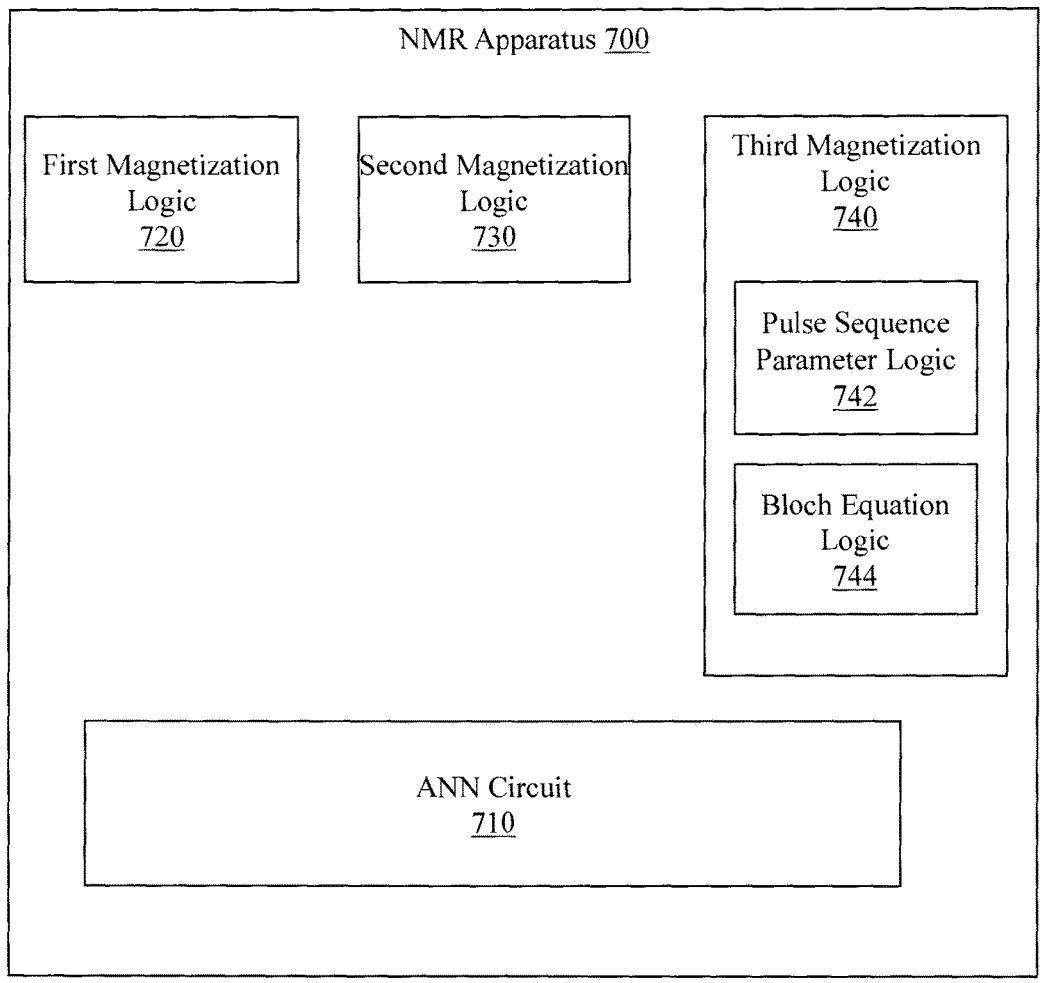
FIG. 7 illustrates an example apparatus for training an ANN for automated MR pulse sequence design.

FIG. 7 illustrates an example apparatus 700 for training an ANN for automated MR pulse sequence design. Apparatus 700 includes an ANN circuit 710. The ANN circuit 710 may be, for example, a back propagation circuit, a Kohonen circuit, a single layer circuit, a multi-layer circuit, or other type of ANN circuit.

Apparatus 700 includes a first magnetization logic 720 that provides initial magnetization values to the ANN circuit 710. The initial magnetization values may be arbitrary values. The initial magnetization values may be provided when starting the training for ANN circuit 710. A wider range of initial magnetization values may be provided than is possible for conventional systems.

Apparatus 700 also includes a second magnetization logic 730 that provides target magnetization values to the ANN circuit 710. The target magnetization values are associated with a known signal evolution produced by a known pulse sequence. For example, the target magnetization values may be associated with known signal evolutions described by any of equations 1-8. More generally, the known pulse sequence is an MRF pulse sequence that varies from sequence block to sequence block in two or more sequence parameters. During training of the ANN circuit 710, different magnetization values associated with the known signal may be provided. In an embodiment where the ANN circuit 710 is trained signal point by signal point, the magnetization values may be selected on a point by point basis from the known signal evolution.

Apparatus 700 also includes a third magnetization logic 740 that provides in-process magnetization values to the ANN circuit 710 for training the ANN circuit 710. In one embodiment, the in-process magnetization values are produced by a pulse sequence parameter logic 742 and a Bloch equation logic 744. The pulse sequence parameter logic 742 may select a selected pulse sequence parameter that minimizes an error function that compares the in-process magnetization values to the target magnetization values. While an error function is described, the pulse sequence parameter logic 742 may select the selected pulse sequence parameter in other ways including, for example, selecting a first value that satisfies an error function threshold, selecting a value that is closest to an average of several values that minimize an error function, or in other ways. In one embodiment, the pulse sequence parameter logic 742 may be fully automated while in another embodiment the pulse sequence parameter logic 742 may apply user inputs for selecting the selected pulse sequence parameter.

The Bloch equation logic 744 produces the in-process magnetization values based, at least in part, on the selected pulse sequence parameter. For example, the selected pulse sequence parameter may be used as one of the values in a Bloch equation. The selected pulse sequence parameter selected by pulse sequence parameter logic 742 may be used to update the ANN circuit 710. The ANN circuit 710 may be updated using, for example, supervised learning, unsupervised learning, link strengthening, link weakening, or other approaches.

Figure 8:
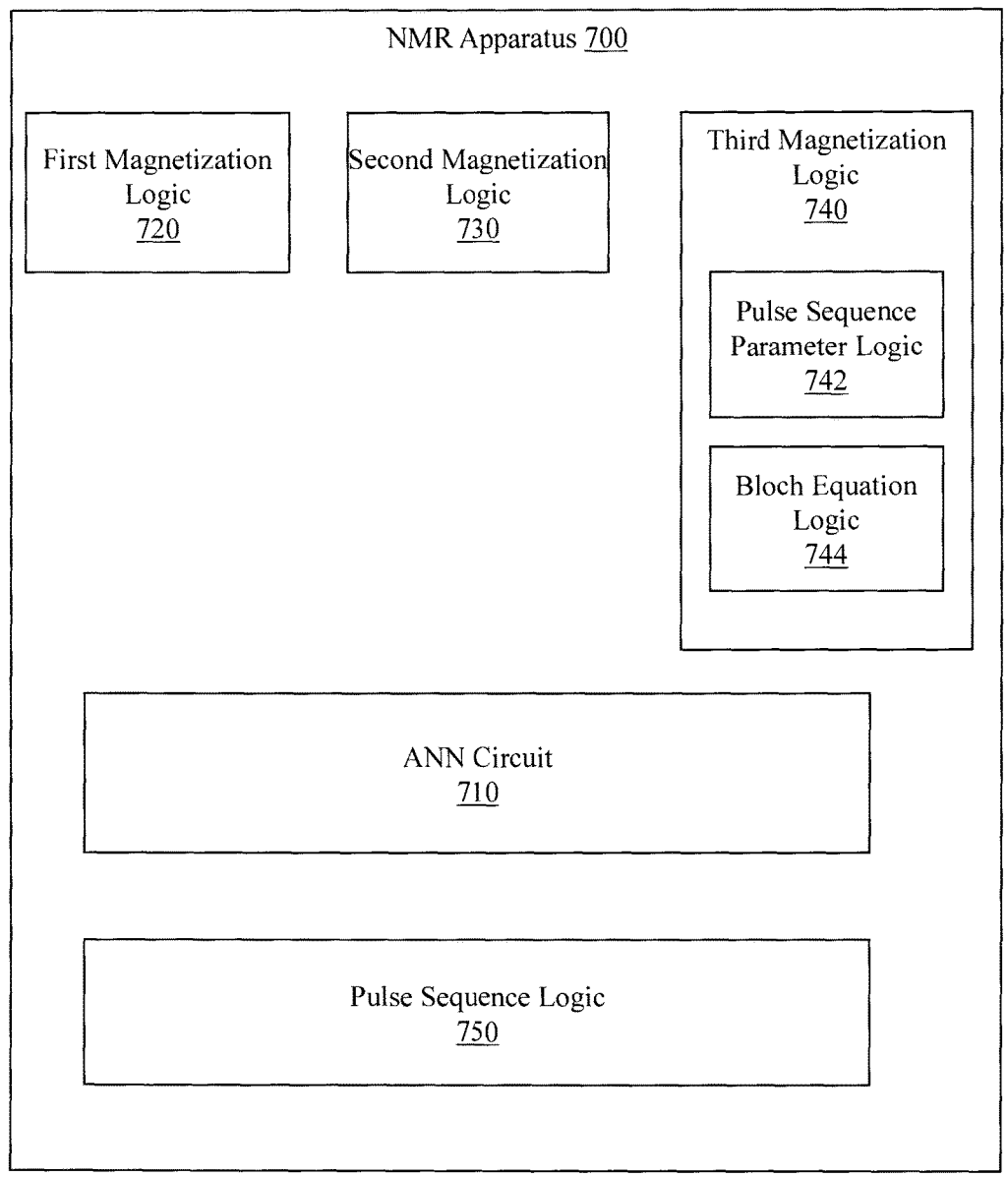
FIG. 8 illustrates an example apparatus for training and using an ANN for automated MR pulse sequence design.

FIG. 8 illustrates another embodiment of apparatus 700. This embodiment may be used both for training and using an ANN for automated MR pulse sequence design. This embodiment of apparatus 700 includes a pulse sequence logic 750 that produces a new pulse sequence using the ANN circuit 710. The new pulse sequence may be, for example, an MRF pulse sequence that produces a signal evolution described by equation 1 or equation 2. In one embodiment, the new pulse sequence may be an MRF pulse sequence that produces a signal evolution described by any of equations 3, 4, 5, 6, 7, or 8. The pulse sequence logic 750 may produce the new pulse sequence in response to receiving production inputs from a user. The production inputs may describe, for example, characteristics of a desired signal evolution. The characteristics of the desired signal evolution may include, for example, maximum amplitude, average instantaneous slope on a curve, number of signal points, whether gradients are balanced, or other characteristics.

Figure 9:
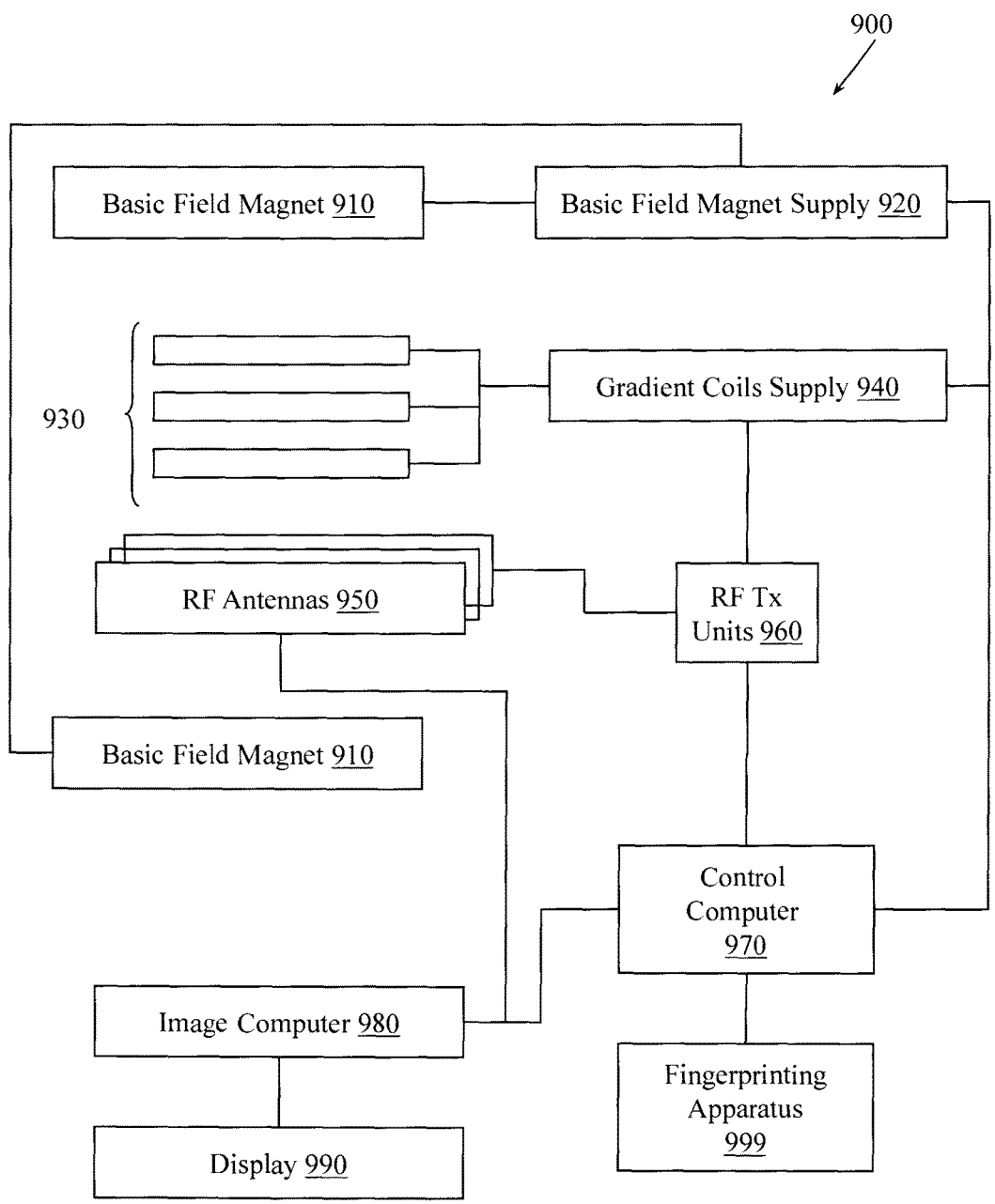
FIG. 9 illustrates an example MRI apparatus.

FIG. 9 illustrates an example MRI apparatus 900 that has a fingerprinting apparatus 999 to facilitate MRI fingerprinting. The fingerprinting apparatus 999 may have elements of example apparatus described herein and/or may perform example methods described herein. For example, the fingerprinting apparatus 999 may have circuits or logics that facilitate training and then using an ANN for MRF pulse sequence design.

In one embodiment, fingerprinting apparatus 999 may perform a method that includes accessing an initial signal associated with a known MR pulse sequence and then accessing a set of initial magnetization values associated with the known signal. The known values may be used as inputs to an ANN. The inputs may be processed by the ANN and training outputs may be produced. The training outputs may be evaluated to determine which training outputs are desired and which are not desired. Thus, the method may include accessing a set of target magnetization values and controlling an ANN to produce a set of pulse sequence parameters based, at least in part, on the set of initial magnetization values and the set of target magnetization values. The ANN may produce a number of outputs having a variety of values. For example, a set of AP and FA values may be produced. The method may, therefore, include selecting an optimal pulse sequence parameter from the set of predicted pulse sequence parameters. During training, the ANN may be updated so that the ANN becomes more likely to produce desired outputs and less likely to produce outputs that are not desired. Therefore the method may include updating the ANN based, at least in part, on the optimal pulse sequence parameter. Once an optimal pulse sequence parameter has been selected from the available pulse sequence parameters produced by the ANN, the method may proceed by controlling a Bloch simulator to update the set of target magnetization values based, at least in part, on the optimal pulse sequence parameter.

Once the ANN has been trained, then the ANN can be used to produce new pulse sequences. Thus, the method may include providing a set of desired pulse sequence parameters to the ANN, and controlling the ANN to produce a new pulse sequence based, at least in part, on the set of desired pulse sequence parameters. The new pulse sequence may produce signal evolutions described by equations 1-8.

The apparatus 900 includes a basic field magnet(s) 910 and a basic field magnet supply 920. Ideally, the basic field magnets 910 would produce a uniform $B_0$ field. However, in practice, the $B_0$ field may not be uniform, and may vary over an object being imaged by the MRI apparatus 900. MRI apparatus 900 may include gradient coils 930 configured to emit gradient magnetic fields like $G_S$, $G_P$ and $G_R$. The gradient coils 930 may be controlled, at least in part, by a gradient coils supply 940. In some examples, the timing, strength, and orientation of the gradient magnetic fields may be controlled, and thus selectively adapted, during an MRI procedure.

MRI apparatus 900 may include a set of RF antennas 950 that generate RF pulses and receive resulting nuclear magnetic resonance signals from an object to which the RF pulses are directed. In some examples, how the pulses are generated and how the resulting MR signals are received may be controlled and thus may be selectively adapted during an MR procedure. Separate RF transmission and reception coils can be employed. The RF antennas 950 may be controlled, at least in part, by a set of RF transmission units 960. An RF transmission unit 960 may provide a signal to an RF antenna 950.

The gradient coils supply 940 and the RF transmission units 960 may be controlled, at least in part, by a control computer 970. In one example, the control computer 970 may be programmed to control an NMR device as described herein. Conventionally, the MR signals received from the RF antennas 950 can be employed to generate an image and thus may be subject to a transformation process like a two dimensional Fast Fourier Transform (FFT) that generates pixilated image data. The transformation can be performed by an image computer 980 or other similar processing device. The image data may then be shown on a display 990.

However, fingerprinting apparatus 999 facilitates not having to do conventional reconstruction of an image from MR signals received from the RF antennas 950. Thus the RF energy applied to an object by apparatus 900 need not be constrained to produce signals with substantially constant amplitudes or phases. Instead, fingerprinting apparatus 999 facilitates matching received signals to known signals for which a reconstruction, relaxation parameter, or other information is already available. This facilitates producing a quantitative result.

While FIG. 9 illustrates an example MRI apparatus 900 that includes various components connected in various ways, it is to be appreciated that other MRI apparatus may include other components connected in other ways.

While example systems, methods, and so on have been illustrated by describing examples, and while the examples have been described in considerable detail, it is not the intention of the applicants to restrict or in any way limit the scope of the appended claims to such detail. It is, of course, not possible to describe every conceivable combination of components or methodologies for purposes of describing the systems, methods, and so on described herein. Therefore, the invention is not limited to the specific details, the representative apparatus, and illustrative examples shown and described. Thus, this application is intended to embrace alterations, modifications, and variations that fall within the scope of the appended claims.

The following includes definitions of selected terms employed herein. The definitions include various examples and/or forms of components that fall within the scope of a term and that may be used for implementation. The examples are not intended to be limiting. Both singular and plural forms of terms may be within the definitions.

References to "one embodiment", "an embodiment", "one example", "an example", and so on, indicate that the embodiment(s) or example(s) so described may include a particular feature, structure, characteristic, property, element, or limitation, but that not every embodiment or example necessarily includes that particular feature, structure, characteristic, property, element or limitation. Furthermore, repeated use of the phrase "in one embodiment" does not necessarily refer to the same embodiment, though it may.

"Logic", as used herein, includes but is not limited to hardware, firmware, software in execution on a machine, or combinations of each to perform a function(s) or an action(s), or to cause a function or action from another logic, method, or system. Logic may include a software controlled microprocessor, a discrete logic (e.g., ASIC), an analog circuit, a digital circuit, a programmed logic device, a memory device containing instructions, and other physical devices. Logic may include one or more gates, combinations of gates, or other circuit components. Where multiple logical logics are described, it may be possible to incorporate the multiple logical logics into one physical logic. Similarly, where a single logical logic is described, it may be possible to distribute that single logical logic between multiple physical logics.

In one embodiment, the functionality associated with a logic may be performed, at least in part, by hardware logic components including, but not limited to, field-programmable gate arrays (FPGAs), application specific integrated circuits (ASICs), application specific standard products (ASSPs), system on a chip systems (SOCs), or complex programmable logic devices (CPLDs).

"User", as used herein, includes but is not limited to one or more persons, software, computers or other devices, or combinations of these.

To the extent that the term "includes" or "including" is employed in the detailed description or the claims, it is intended to be inclusive in a manner similar to the term "comprising" as that term is interpreted when employed as a transitional word in a claim.

To the extent that the term or is employed in the detailed description or claims (e.g., A or B) it is intended to mean "A or B or both". When the applicants intend to indicate "only A or B but not both" then the term "only A or B but not both" will be employed. Thus, use of the term or herein is the inclusive, and not the exclusive use. See, Bryan A. Garner, A Dictionary of Modern Legal Usage 624 (2d. Ed. 1995).

What is claimed is:

1. A method for training an artificial neural network (ANN) for use in automatically producing a magnetic resonance fingerprinting (MRF) pulse sequence, the method comprising:
    accessing, by a computer system, an initial signal associated with a known pulse sequence;
    accessing, by the computer system, a set of initial magnetization values associated with the initial signal;
    accessing, by the computer system, a set of target magnetization values;
    controlling, by the computer system, the ANN to produce a set of flip angle (FA) values for the MRF pulse sequence and a set of acquisition period (AP) values for the MRF pulse sequence based, at least in part, on the set of initial magnetization values and the set of target magnetization values;
    selecting, by the computer system, an FA value from the set of FA values;
    selecting, by the computer system, an AP value from the set of AP values;
    updating, by the computer system, the ANN based, at least in part, on the FA value or the AP value;
    controlling, by the computer system, a Bloch simulator to update the set of initial magnetization values based, at least in part, on the FA value or the AP value;
    providing, by the computer system, a set of production inputs to the ANN; and
    controlling, by the computer system, the ANN to produce a new pulse sequence based on the set of production inputs, where the new pulse sequence varies echo time and flip angle between at least two sequence blocks.

2. The method of claim 1, where the known pulse sequence is a TrueFISP signal.

3. The method of claim 1, where the set of initial magnetization values include arbitrary initial magnetizations.

4. The method of claim 1, where the known pulse sequence is described by:

$$SE = \sum_{s=1}^{N_S} \prod_{i=1}^{N_A} \sum_{j=1}^{N_{RF}} R_i(\alpha) R_{RF_{ij}}(\alpha, \phi) R(G) E_i(T1, T2, D) M_0$$

or $$SE = \sum_{s=1}^{N_S} \prod_{i=1}^{N_A} \prod_{j=1}^{N_{RF}} R_i(\alpha) R_{RF_{ij}}(\alpha, \phi) R(G) E_i(T1, T2, D) M_0$$

where:
SE is a signal evolution,
$N_S$ is a number of spins,
$N_A$ is a number of sequence blocks,
$N_{RF}$ is a number of RF pulses in a sequence block,
α is a flip angle,
φ is a phase angle,
$R_i(\alpha)$ is a rotation due to off resonance,
$R_{RF_{ij}}(\alpha,\phi)$ is a rotation due to RF differences,
R(G) is a rotation due to a gradient,
T1 is spin-lattice relaxation,
T2 is spin-spin relaxation,
D is diffusion relaxation,
$E_i(T1,T2,D)$ is decay due to relaxation differences, and
$M_0$ is the default or equilibrium magnetization.

5. The method of claim 1, where the known pulse sequence is described by:

$$S_i = R_i E_i(S_{i-1})$$

or $$S_i = R_i E_i \sum_{x=1}^{i-1} R_x E_x(S_x)$$

or $$S_i = R_i E_i \prod_{x=1}^{i-1} R_x E_x(S_x)$$

where:
$S_{i=0}$ is the default or equilibrium magnetization,
$S_i$ is a vector that represents the different components of the magnetization Mx, My, Mz during acquisition block i,
$R_i$ is the combination of rotational effects that occur during acquisition block i, and
$E_i$ is the combination of effects that alter the amount of magnetization in the different states for acquisition block i.

6. The method of claim 1, where the known pulse sequence is described by:

$$S_i = \sum_{s=1}^{N_s} R_{s,i} E_{s,i}(S_{s,i-1})$$

or $$S_i = \sum_{s=1}^{N_s} R_{s,i} E_{s,i} \sum_{x=1}^{i-1} R_{s,x} E_{s,x}(S_{s,x})$$

or $$S_i = \sum_{s=1}^{N_s} R_{s,i} E_{s,i} \prod_{x=1}^{i-1} R_{s,x} E_{s,x}(S_{s,x})$$

where:
$S_{i=0}$ is the default or equilibrium magnetization,
Ns is the number of spins,
$S_i$ is a vector that represents the different components of the magnetization Mx, My, Mz during acquisition block i,
$R_{i,s}$ is the sum of rotational effects that occur during acquisition block i for spin s, and
$E_{i,s}$ is the sum of effects that alter the amount of magnetization in the different states for acquisition block i for spin s.

7. The method of claim 1, where the FA value or the AP value is selected based, at least in part, by identifying a member of the set of FA values or a member of the set of AP values that minimize an error function.

8. The method of claim 1, where the ANN has one block of ANN nodes per AP value being evaluated.

9. The method of claim 8, where the FA value or the AP value is selected by identifying the member of the set of FA values and the member of the set of AP values that minimize:

$$\|s(i) - BE(FA_n, AP_n)\|,$$

where:
S(i) is the signal at the $i^{th}$ excitation in transverse plane, i being a number, $FA_n$ is the specific FA of the $n^{th}$ block of ANN nodes, n being a number,
$AP_n$ is the specific AP of the $n^{th}$ block of ANN nodes, and
$BE(FA_n, AP_n)$ is the result of a Bloch simulation of $FA_n$ and $AP_n$.

10. The method of claim 1, where the ANN has M blocks of ANN nodes per AP, M being a number greater than 1.

11. The method of claim 10, where the FA value or the AP value is selected by identifying the member of the set of FA values and the member of the set of AP values that minimize:

$$\|s(i) - BE(FA_{n,m}, AP_{n,m})\|,$$

where:
S(i) is the signal at the $i^{th}$ excitation in transverse plane, i being a number,
$FA_{n,m}$ is the specific FA of the $n^{th}$ ANN in the block m, n and m being numbers,
$AP_{n,m}$ is the specific AP of the $n^{th}$ ANN in the block m, and
$BE(FA_{n,m}, AP_{n,m})$ is the result of a Bloch simulation of $FA_{n,m}$ and $AP_{n,m}$.

12. The method of claim 1, where controlling the Bloch simulator to update the set of target magnetization values includes controlling the Bloch simulator to update the set of target magnetization values based, at least in part, on the FA value and the AP value.

13. The method of claim 1, where the new pulse sequence varies echo time, flip angle, phase encoding, diffusion encoding, flow encoding, RF pulse amplitude, RF pulse phase, number of RF pulses, type of gradient applied between an excitation portion of a sequence block and a readout portion of a sequence block, number of gradients applied between an excitation portion of a sequence block and a readout portion of a sequence block, type of gradient applied between a readout portion of a sequence block and an excitation portion of a sequence block, number of gradients applied between a readout portion of a sequence block and an excitation portion of a sequence block, type of gradient applied during a readout portion of a sequence block, number of gradients applied during a readout portion of a sequence block, amount of RF spoiling, or amount of gradient spoiling between sequence blocks.

14. An apparatus, comprising:
a processor in communication with an artificial neural network (ANN) circuit forming a computer system configured to:
provide initial magnetization values to the ANN circuit, where the initial magnetization values may be arbitrary;
provide target magnetization values to the ANN circuit, where the target magnetization values are associated with an initial signal produced by a known pulse sequence, where the known pulse sequence is a magnetic resonance fingerprinting (MRF) pulse sequence that varies from sequence block to sequence block in two or more sequence parameters; and
provide in process magnetization values to the ANN circuit for training the ANN circuit, where the in process magnetization values are produced by:
selecting a selected pulse sequence parameter that minimizes an error function that compares the in process magnetization values to the target magnetization values, using a Bloch equation to produce the in process magnetization values based, at least in part, on the selected pulse sequence parameter;

provide a set of production inputs to the ANN; and control the ANN to produce a new pulse sequence based on the set of production inputs, where the new pulse sequence varies echo time and flip angle between at least two sequence blocks.

15. The apparatus of claim 14, where the known pulse sequence is a magnetic resonance fingerprinting (MRF) pulse sequence that produces a signal evolution described by:

$$SE = \sum_{s=1}^{N_s} \prod_{i=1}^{N_A} \sum_{j=1}^{N_{RF}} R_i(\alpha) R_{RF_{ij}}(\alpha, \phi) R(G) E_i(T1, T2, D) M_0$$

or $$SE = \sum_{s=1}^{N_s} \prod_{i=1}^{N_A} \prod_{j=1}^{N_{RF}} R_i(\alpha) R_{RF_{ij}}(\alpha, \phi) R(G) E_i(T1, T2, D) M_0$$

where:
SE is a signal evolution,
$N_S$ is a number of spins,
$N_A$ is a number of sequence blocks,
$N_{RF}$ is a number of RF pulses in a sequence block,
A is a flip angle,
φ is a phase angle,
$R_i(\alpha)$ is a rotation due to off resonance,
$R_{RF_{ij}}(\alpha,\phi)$ is a rotation due to RF differences,
R(G) is a rotation due to a gradient,
T1 is spin-lattice relaxation,
T2 is spin-spin relaxation,
D is diffusion relaxation,
$E_i(T1,T2,D)$ is decay due to relaxation differences, and
$M_0$ is the default or equilibrium magnetization.

16. The apparatus of claim 14, where the known pulse sequence is a magnetic resonance fingerprinting (MRF) pulse sequence that produces a signal evolution described by:

$$S_i = R_i E_i (S_{i-1})$$

or $$S_i = R_i E_i \sum_{x=1}^{i-1} R_x E_x (S_x)$$

or $$S_i = R_i E_i \prod_{x=1}^{i-1} R_x E_x (S_x)$$

or $$S_i \sum_{s=1}^{N_s} R_{s,i} E_{s,i} (S_{s,i-1})$$

or $$S_i = \sum_{s=1}^{N_s} R_{s,i} E_{s,i} \sum_{x=1}^{i-1} R_{s,x} E_{s,x} (S_{s,x})$$

or $$S_i = \sum_{s=1}^{N_s} R_{s,i} E_{s,i} \prod_{x=1}^{i-1} R_{s,x} E_{s,x} (S_{s,x})$$

where
$S_i$ is a vector that represents the different components of the magnetization Mx, My, Mz during acquisition block i,
$N_s$ is the number of spins,
$R_i$ is the combination of rotational effects that occur during acquisition block i,
$R_{i,s}$ is the combination of rotational effects that occur during acquisition block i for spin s,
$E_i$ is the combination of effects that alter the amount of magnetization in the different states for acquisition block i, and
$E_{i,s}$ is the combination of effects that alter the amount of magnetization in the different states for acquisition block i for spin s.

17. The apparatus of claim 15, where the computer system is further configured to:
produce a new pulse sequence using the ANN circuit.

18. The apparatus of claim 17, where the new pulse sequence is a magnetic resonance fingerprinting (MRF) pulse sequence that produces a signal evolution described by:

$$SE = \sum_{s=1}^{N_s} \prod_{i=1}^{N_A} \sum_{j=1}^{N_{RF}} R_i(\alpha) R_{RF_{ij}}(\alpha, \phi) R(G) E_i(T1, T2, D) M_0$$

or $$SE = \sum_{s=1}^{N_s} \prod_{i=1}^{N_A} \prod_{j=1}^{N_{RF}} R_i(\alpha) R_{RF_{ij}}(\alpha, \phi) R(G) E_i(T1, T2, D) M_0$$

where:
SE is a signal evolution,
$N_S$ is a number of spins,
$N_A$ is a number of sequence blocks,
$N_{RF}$ is a number of RF pulses in a sequence block,
α is a flip angle,
φ is a phase angle,
$R_i(\alpha)$ is a rotation due to off resonance,
$R_{RF_{ij}}(\alpha,\phi)$ is a rotation due to RF differences,
R(G) is a rotation due to a gradient,
T1 is spin-lattice relaxation,
T2 is spin-spin relaxation,
D is diffusion relaxation,
$E_i(T1,T2,D)$ is decay due to relaxation differences, and
$M_0$ is the default or equilibrium magnetization.

19. The apparatus of claim 17, where the new pulse sequence is a magnetic resonance fingerprinting (MRF) pulse sequence that produces a signal evolution described by:

$$S_i = R_i E_i (S_{i-1})$$

or $$S_i = R_i E_i \sum_{x=1}^{i-1} R_x E_x (S_x)$$

or $$S_i = R_i E \prod_{x=1}^{i-1} R_x E_x (S_x)$$

or

-continued $$S_i = \sum_{s=1}^{N_s} R_{s,i} E_{s,i}(S_{s,i-1})$$

or $$S_i = \sum_{s=1}^{N_s} R_{s,i} E_{s,i} \sum_{x=1}^{i-1} R_{s,x} E_{s,x}(S_{s,x})$$

or $$S_i = \sum_{s=1}^{N_s} R_{s,i} E_{s,i} \prod_{x=1}^{i-1} R_{s,x} E_{s,x}(S_{s,x})$$

where
- $S_i$ is a vector that represents the different components of the magnetization Mx, My, Mz during acquisition block i,
- $N_s$ is the number of spins,
- $R_i$ is the combination of rotational effects that occur during acquisition block i,
- $E_i$ is the combination of effects that alter the amount of magnetization in the different states for acquisition block i,
- $R_{i,s}$ is the combination of rotational effects that occur during acquisition block i for spin s, and
- $E_{i,s}$ is the combination of effects that alter the amount of magnetization in the different states for acquisition block i for spin s.

20. A method, comprising:
  accessing, by a computer system, an initial signal associated with a known magnetic resonance (MR) pulse sequence;
  accessing, by the computer system, a set of initial magnetization values associated with the initial signal;
  accessing, by the computer system, a set of target magnetization values;
  controlling, by the computer system, an artificial neural network (ANN) to produce a set of target pulse sequence parameters based, at least in part, on the set of initial magnetization values and the set of target magnetization values;
  selecting, by the computer system, a pulse sequence parameter from the set of target pulse sequence parameters;
  updating, by the computer system, the ANN based, at least in part, on the pulse sequence parameter;
  controlling, by the computer system, a Bloch simulator to update the set of target magnetization values based, at least in part, on the pulse sequence parameter;
  providing, by the computer system, a set of production inputs to the ANN; and
  controlling, by the computer system, the ANN to produce a new pulse sequence based on the set of production inputs, where the new pulse sequence varies echo time and flip angle between at least two sequence blocks.

* * * * *